(12) United States Patent
Qu

(10) Patent No.: US 11,928,808 B2
(45) Date of Patent: Mar. 12, 2024

(54) WAFER DETECTION METHOD, DEVICE, APPARATUS, AND STORAGE MEDIUM

(71) Applicant: CHANGXIN MEMORY TECHNOLOGIES, INC., Hefei (CN)

(72) Inventor: Deqing Qu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 456 days.

(21) Appl. No.: 17/401,595

(22) Filed: Aug. 13, 2021

(65) Prior Publication Data

US 2022/0222810 A1    Jul. 14, 2022

Related U.S. Application Data

(63) Continuation of application No. PCT/CN2021/100012, filed on Jun. 15, 2021.

(30) Foreign Application Priority Data

Jan. 8, 2021   (CN) .......................... 202110022536.3

(51) Int. Cl.
*G06T 7/11*    (2017.01)
*G01N 21/95*   (2006.01)
*G06T 7/00*    (2017.01)

(52) U.S. Cl.
CPC ....... *G06T 7/0008* (2013.01); *G01N 21/9501* (2013.01); *G06T 7/11* (2017.01); *G06T 2207/30148* (2013.01)

(58) Field of Classification Search
CPC .................... G06T 7/0008; G06T 7/11; G06T 2207/30148; G06T 2207/20081;
(Continued)

(56) References Cited

U.S. PATENT DOCUMENTS 11,341,626 B2*  5/2022 Wen .......................... G06T 7/11
2009/0080759 A1*  3/2009 Bhaskar .................. G06T 7/001
382/141

(Continued)

FOREIGN PATENT DOCUMENTS

CN    109671058 A    4/2019
CN    109949286 A    6/2019
(Continued)

*Primary Examiner* — Roy M Punnoose
(74) *Attorney, Agent, or Firm* — Cooper Legal Group, LLC

(57) ABSTRACT

The disclosure provides a wafer detection method, device, apparatus, and a storage medium. The method includes: an original wafer picture to be detected is received; picture segmentation is performed on the original wafer picture to acquire a plurality of first pictures; picture zooming is performed on the original wafer picture and the first pictures to respectively acquire a second picture and a plurality of third pictures, the second picture and the third pictures meet an input size requirement of the wafer detection model to an input picture; the second picture and the third pictures are sequentially input into a wafer detection model to acquire a first detection result corresponding to the second picture and a second detection result corresponding to each third picture; and a total detection result of the original wafer picture is determined according to the first detection result and the second detection results.

20 Claims, 4 Drawing Sheets

(58) Field of Classification Search
CPC .......... G06T 2207/20084; G06T 7/001; G01N 21/9501; H01L 22/12
See application file for complete search history.

(56) References Cited

U.S. PATENT DOCUMENTS

| | | | |
|---|---|---|---|
| 2010/0124375 A1* | 5/2010 | Wu | G06T 7/187 382/173 |
| 2010/0188486 A1* | 7/2010 | Amanullah | G01N 21/9501 348/48 |
| 2010/0189339 A1* | 7/2010 | Amanullah | G01N 21/8806 382/145 |
| 2020/0294222 A1 | 9/2020 | Wen et al. | |
| 2020/0294224 A1 | 9/2020 | Shaubi et al. | |

FOREIGN PATENT DOCUMENTS

| | | |
|---|---|---|
| CN | 110327013 A | 10/2019 |
| CN | 110717881 A | 1/2020 |
| CN | 110889823 A | 3/2020 |
| CN | 111512324 A | 8/2020 |
| CN | 111652846 A | 9/2020 |

* cited by examiner

WAFER DETECTION METHOD, DEVICE, APPARATUS, AND STORAGE MEDIUM

CROSS-REFERENCE TO RELATED APPLICATIONS

This application is a continuation of International patent application No. PCT/CN2021/100012, filed on Jun. 15, 2021, which is filed based upon and claims priority to Chinese patent application No. 202110022536.3, filed on Jan. 8, 2021. The contents of International patent application No. PCT/CN2021/100012 and Chinese patent application No. 202110022536.3 are incorporated herein by reference in their entireties.

TECHNICAL FIELD

The present disclosure relates to the field of semiconductor production, and in particular to a wafer detection method, device, apparatus, and a storage medium.

BACKGROUND

A wafer is a basic raw material for manufacturing a semiconductor device. A semiconductor with extremely high purity is prepared into the wafer through working procedures, for example, crystal pulling, slicing, and the like. The wafer forms an extremely tiny circuit structure through a series of semiconductor manufacturing processes, and then becomes a chip through cutting, packaging, and testing. The chip is widely applied to various electronic apparatuses.

A wafer manufacturing process is extremely complex and mainly includes: for example, exposure, etching, ion implantation, thin film deposition, chemical mechanical polishing and other steps, up to six hundred to thousands of steps in actual production and manufacturing. Defects of the wafer are various in type and different in shape and size. At present, a conventional computer vision detection manner is adopted, so that the defect detection effect on the wafer is poor, and the detection precision is especially poor for small-scale wafer defects.

SUMMARY

In a first aspect, an embodiment of the present disclosure provides a wafer detection method, which includes as follows.

An original wafer picture to be detected is received.

Picture segmentation is performed on the original wafer picture to acquire a plurality of first pictures, and the plurality of first pictures are partially overlapped.

Picture zooming is performed on the original wafer picture to acquire a second picture.

The picture zooming is performed on the plurality of first pictures to acquire a plurality of third pictures.

The second picture and the plurality of third pictures are sequentially input into a wafer detection model to acquire a first detection result corresponding to the second picture and a second detection result corresponding to each third picture.

A total detection result of the original wafer picture is determined according to the first detection result and the plurality of second detection results.

In a second aspect, an embodiment of the present disclosure provides a wafer detection device, including a processor; and a memory configured to store instructions executable by the processor.

The processor is configured to: receive an original wafer picture to be detected;

perform picture segmentation on the original wafer picture to acquire a plurality of first pictures, the plurality of first pictures being partially overlapped;

perform picture zooming on the original wafer picture to acquire a second picture;

perform the picture zooming on the plurality of first pictures to acquire a plurality of third pictures;

sequentially input the second picture and the plurality of third pictures into a wafer detection model to acquire a first detection result corresponding to the second picture and a second detection result corresponding to each third picture; and determine a total detection result of the original wafer picture according to the first detection result and the plurality of second detection results.

In a third aspect, an embodiment of the present disclosure provides a non-transitory computer-readable storage medium having stored therein instructions that, when executed by a processor of a wafer detection device, causes the wafer detection device to perform the wafer detection method in the first aspect.

DETAILED DESCRIPTION

Figure 1:
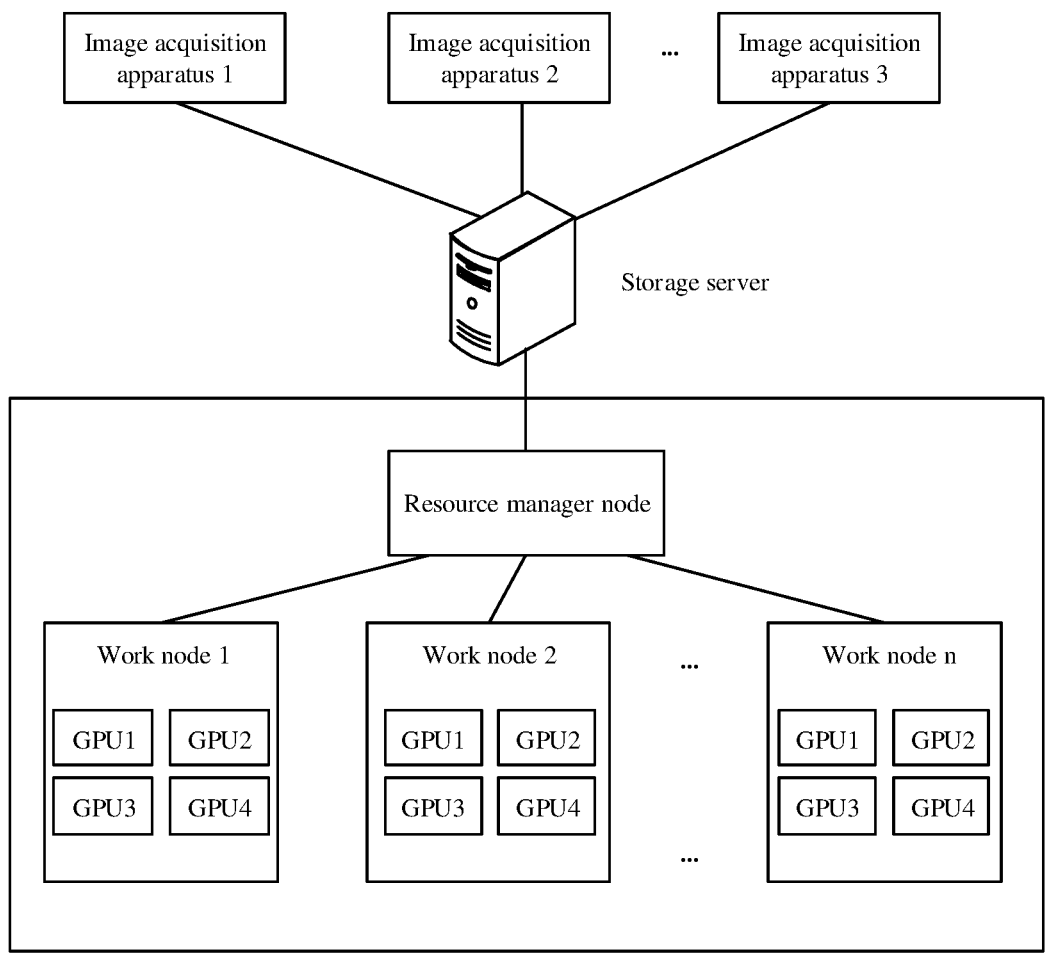
FIG. 1 is an architecture schematic diagram of a wafer inspection system provided by an embodiment of the present disclosure.

Technical solutions in embodiments of the present disclosure will be clearly and completely described below in combination with the accompanying drawings in the embodiments of the present disclosure. Apparently, the described embodiments are only a part of the embodiments of the present disclosure and not all the embodiments. Based on the embodiments in the present disclosure, all other embodiments acquired by those skilled in the art without involving any inventive effort fall within the protection scope of the present disclosure.

The terms "first", "second", and the like in the specification and claims of the present disclosure and in the above drawings are used for distinguishing similar objects and unnecessarily for describing a specific sequence or sequential order. It is to be understood that such data may be interchangeable where appropriate, so that the embodiments of the present disclosure described herein can be, for example, implemented in a sequence in addition to those illustrated or described herein.

Furthermore, the terms "include" and "having", as well as any variations thereof, are intended to cover a non-exclusive inclusion, for example, a process, a method, a system, a product, or an apparatus that includes a series of steps or elements is not necessarily limited to those expressly listed steps or elements, but may include other steps or elements not expressly listed or inherent to such process, method, product, or apparatus.

The technical solutions provided by embodiments of the present disclosure relate to the field of semiconductor wafer production, in particular to the field of defect detection during wafer production.

Chip (that is, an integrated circuit) industry is the strategic, fundamental and leading industry of national economic and social development and plays a key role in computer, consumer electronics, network communication, automotive electronics, and other fields. A production and manufacturing flow of the chip is very complex, and a wafer is main material for manufacturing the chip, and a surface defect thereof is a main obstacle influencing the product yield. By defecting the surface defect of the wafer, not only a defective crystal grain may be found, but also a fault existing in a process flow may be determined according to a distribution manner of the defective crystal grain, so that an engineer may improve the process.

At present, wafer defect detection is mainly divided into two types, one is to detect electrical performance of a crystal grain through probe testing, and the other is to detect the surface defect of the wafer through manual visual detection. Both two manners require an experienced engineer to analyze and determine, consume manpower, are high in labor intensity, and are liable to occur an error. In the case that the production capacity of a factory is continuously improved, the detection efficiency through a manual manner is low.

As the detection technology is continuously developed, a detection method based on image recognition appears. The detection method can improve the wafer detection efficiency and accuracy to some extent. The detection method mainly includes the following steps: feature extraction is performed on a wafer picture first, then the extracted feature is input into a machine learning model for determination, and a wafer defect of the wafer picture is classified and recognized. However, the above detection method has poor defect detection effect on the wafer, low accuracy and high false alarm rate.

Subsequently, a detection method based on depth learning appears. Depth learning is the most popular machine learning method at present, needs a large amount of training data, and can further improve the wafer detection accuracy and reduce the false alarm rate compared with the detection method based on image recognition. However, the wafer defects are various in type, for example, a large-size scratch defect and a small-size particle defect. For the small-size defect (for example, within 10×10 pixels) occurring in the wafer picture, in the case of meeting a size requirement of a depth learning model to an input picture, the small-size defect may not be recognized due to picture compression, thereby resulting in defect information loss.

Aiming at the above problems, an embodiment of the present disclosure provides a wafer defect detection solution based on a depth neural network model. In addition to the operation that an original wafer picture is compressed and then is input into a wafer detection model, the small-size wafer defect is taken into consideration, a design is as follows that picture segmentation is performed on the original wafer picture, a segmented picture is zoomed to meet a model input requirement, the segmented picture after picture zooming is also input into the wafer detection model, and whether the wafer defect exists in the original wafer picture is determined through combination of the two types of wafer pictures.

Before the wafer detection method provided by the embodiment of the present disclosure is introduced, the system architecture of the method is briefly introduced first.

Exemplarily, FIG. 1 is an architecture schematic diagram of a wafer inspection system provided by an embodiment of the present disclosure. As illustrated in FIG. 1, the wafer inspection system provided by the embodiment of the present disclosure includes a plurality of image acquisition apparatuses, a storage server, at least one resource manager node (FIG. 1 shows one resource manager node), and a plurality of work nodes. Each image acquisition apparatus is connected with the storage server, the storage server is connected with the resource manager node, and a resource manager server is respectively connected with the plurality of work nodes. Each work node includes a plurality of graphics processing unit (GPUs), and the GPU is configured to actually execute a wafer detection task.

The image acquisition apparatus is configured to acquire a picture of each wafer on a production line, and the image acquisition apparatus stores the acquired wafer picture on the storage server. As an example, the image acquisition apparatus may be set on a detection machine table of the production line.

The storage server of the embodiment is configured to store the wafer pictures from different image acquisition apparatuses and trigger a GPU cluster to perform the intelligent defect detection on the wafer pictures. The GPU cluster includes the resource manager node (RMN for short) and the work node (WN for short). The resource manager node is responsible for scheduling the wafer detection task, and the work node is responsible for executing the wafer detection task.

In an embodiment of the present disclosure, the storage server sends the wafer detection task to the resource manager node. Through a two-stage scheduling algorithm, the wafer detection task is issued to the GPU which actually executes the task. Specifically, the resource manager node allocates the wafer detection task to the work node, and then the work node allocates the wafer detection task to the GPU.

In an embodiment of the present disclosure, the resource manager node may allocate the wafer detection task to the work node by adopting a polling algorithm based on dynamic weight and periodically check a health state of each work node connected with the resource manager node.

As an example, the wafer detection model is preset in the GPU illustrated in FIG. 1. The model may be acquired by training based on an arbitrary depth learning model. A large number of computing resources are consumed for defecting the defect in the wafer picture by using the wafer detection model. Through hardware acceleration performed on the GPU, compared with a central processing unit (CPU), performance improvement may reach more than 10 times, and the real-time requirement of the wafer detection is met.

The technical solutions of the present disclosure will be illustrated below in detail with specific embodiments. The following specific embodiments may be combined, and the same or similar concepts or procedures may not be repeated in some embodiments.

Figure 2:
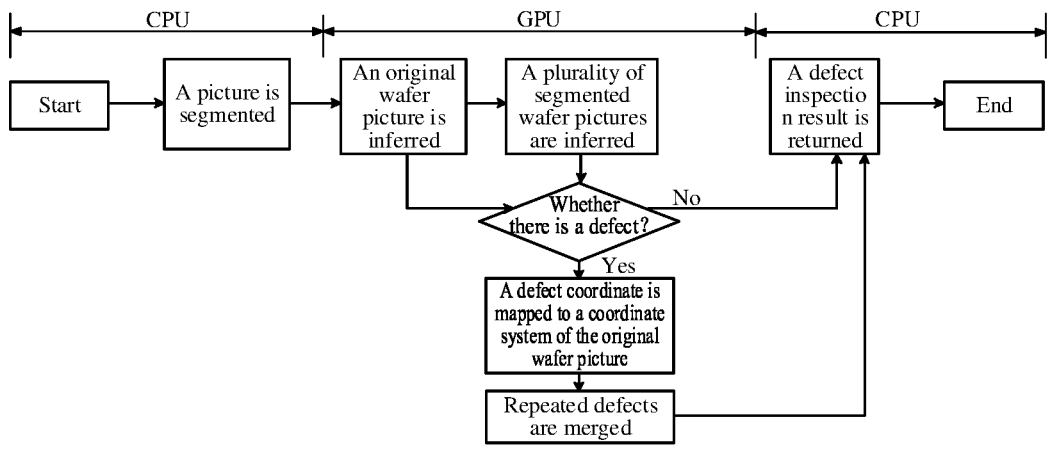
FIG. 2 is a first flowchart of a wafer detection method provided by an embodiment of the present disclosure.

Exemplarily, FIG. 2 is a first flowchart of a wafer detection method provided by an embodiment of the present disclosure. As illustrated in FIG. 2, the wafer detection method provided by the embodiment of the present disclosure may be applied to any work node illustrated in FIG. 1, the work node includes two parts: the CPU and the GPU. An execution flow of the work node runs on two hardware apparatuses: the CPU and the GPU. The CPU part is responsible for preprocessing the original wafer picture, for example, the segmented picture in FIG. 2, and the segmented picture may be understood as segmenting the original wafer picture into a plurality of small pictures with the same size. The GPU part is responsible for a defect detection task of the wafer picture in the wafer detection task. Before the GPU executes the defect detection task, an execution file related to the defect detection task is dispatched from the CPU first, the execution file including a model parameter of the wafer detection model and the like; and the original wafer picture and the segmented wafer picture are inferred based on the execution file to determine whether the wafer defect exists in the original wafer picture and the segmented wafer picture.

It is to be noted that the GPU infers the segmented wafer picture through the wafer detection model, and if it is determined that the wafer defect exists in the segmented wafer picture, a defect coordinate may be mapped to a coordinate system of the original wafer picture, repeated defects are merged, and a defect detection result of the original wafer picture is determined. Finally, the CPU part is responsible for returning the defect detection result of/from the GPU so as to finish a flow.

Optionally, in some embodiments, the above preprocessing further includes at least one of rotation, clipping, scaling, or numerical normalization of the original wafer picture. Data normalization refers to that an RGB value and position information of each pixel in the wafer picture are normalized to be between [0, 1]. Normalization to [0, 1] has the advantage that data values (RGB values, positions) of different dimensions may be compared through the same measurement unit, so that a contribution value of each feature to a result is the same. The preprocessed wafer picture meets a requirement of a wafer detection model to the input picture.

As can be seen from the description of the above embodiment, in an inference stage of the wafer detection model, the picture segmentation is performed on the original wafer picture first, then the original wafer picture and the segmented picture are inferred one by one, and if the wafer defect is detected in the segmented picture, the coordinate system of the defect is mapped to the coordinate system of the original picture. Since the segmented picture has an overlapping part, the repeated defects need to be merged. The above inference procedure is executed on the GPU so as to improve the processing speed of model inference.

Figure 3:
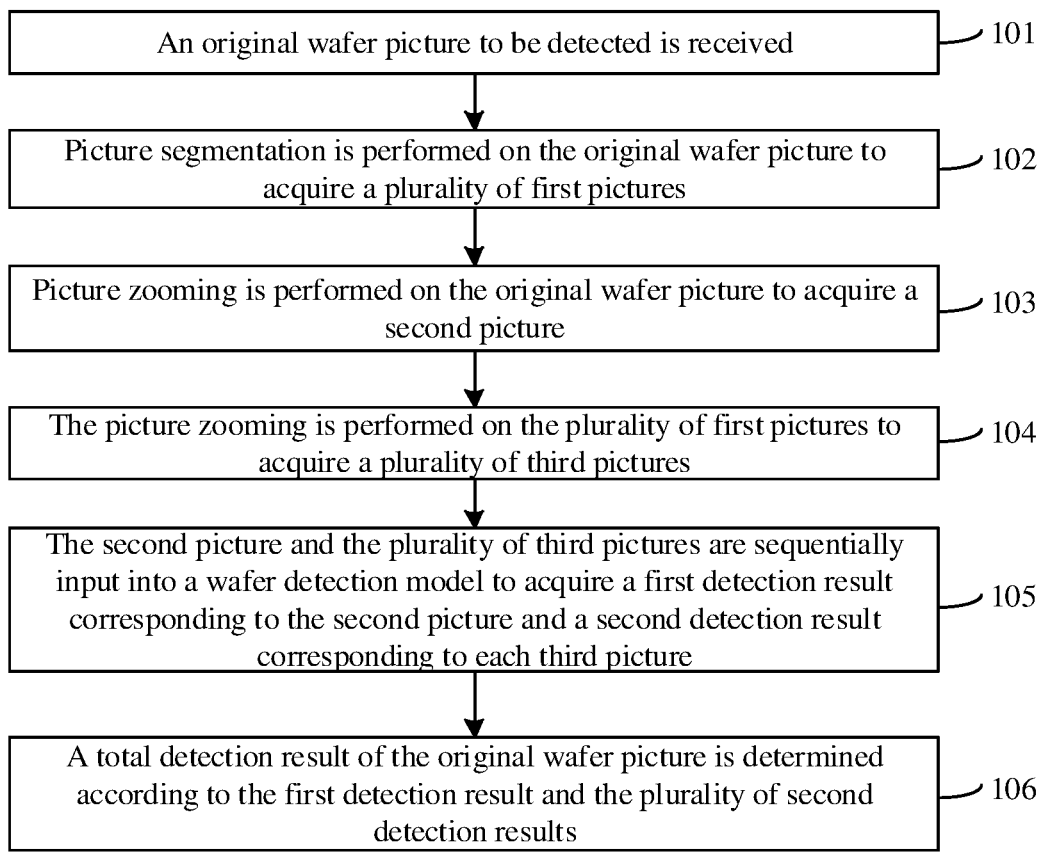
FIG. 3 is a second flowchart of a wafer detection method provided by an embodiment of the present disclosure.

Based on the embodiment illustrated in FIG. 2, model input and model inference procedures of the wafer detection model are described in detail through one specific embodiment. Exemplarily, FIG. 3 is a second flowchart of a wafer detection method provided by an embodiment of the present disclosure. As illustrated in FIG. 3, the wafer detection method provided by the embodiment of the present disclosure includes as follows.

At S101, an original wafer picture to be detected is received.

At S102, picture segmentation is performed on the original wafer picture to acquire a plurality of first pictures.

The plurality of first pictures are partially overlapped.

In an embodiment of the present disclosure, the picture segmentation may be performed on the original wafer picture by adopting a preset sliding window to acquire the plurality of first pictures. Exemplarily, the picture segmentation is performed on a high-resolution original wafer picture (N×N) to acquire a plurality of low-resolution first pictures (N/n×N/n).

As an example, the size of the original wafer picture is N×N, and the size of the sliding window is N/n×N/n. The operation that the picture segmentation is performed on the original wafer picture by adopting the preset sliding window to acquire the plurality of first pictures includes: the preset sliding window is moved by taking N/2n as a step size in a first direction and a second direction respectively to acquire (2n−1)×(2n−1) first pictures. The first direction and the second direction are perpendicular to each other.

N represents the number of pixels, for example, the size of a certain original wafer picture is 2048×2048, and n is a positive integer greater than or equal to 2.

Figure 4:
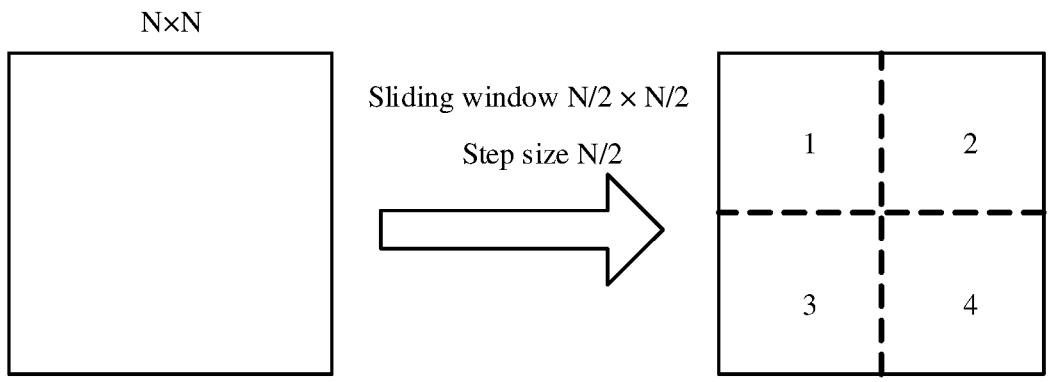
FIG. 4 is a first segmentation schematic diagram of an original wafer picture provided by an embodiment of the present disclosure.

Exemplarily, FIG. 4 is a first segmentation schematic diagram of an original wafer picture provided by an embodiment of the present disclosure. As illustrated in FIG. 4, the picture segmentation is performed on the high-resolution original wafer picture (N×N). If N/n is adopted as the step size and n is 2, as an example, four low-resolution first pictures (N/2×N/2) may be acquired, that is, picture 1 to picture 4 respectively.

Figure 5:
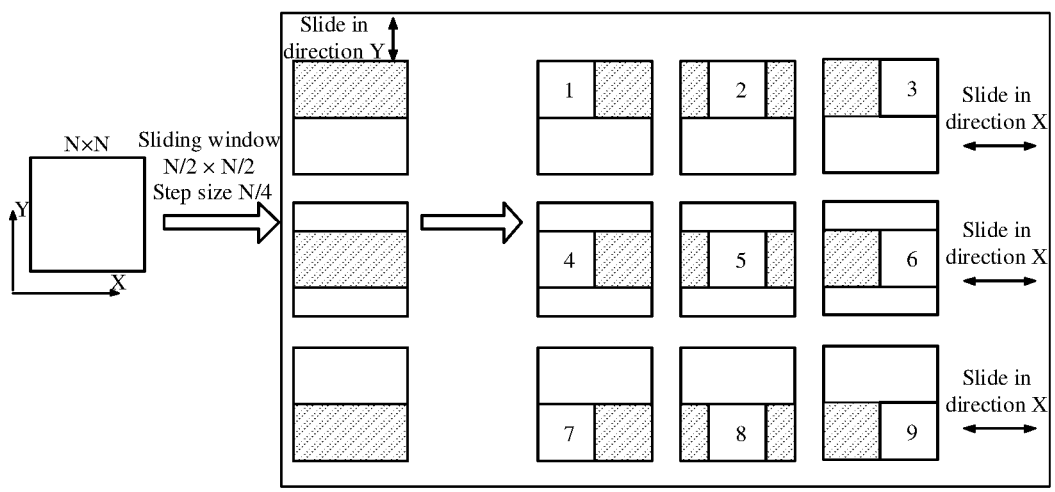
FIG. 5 is a second segmentation schematic diagram of an original wafer picture provided by an embodiment of the present disclosure.

Exemplarily, FIG. 5 is a second segmentation schematic diagram of an original wafer picture provided by an embodiment of the present disclosure. As illustrated in FIG. 5, the picture segmentation is performed on the high-resolution original wafer picture (N×N). If N/2n is adopted as the step size and n is 2, as an example, (2n−1)×(2n−1) first pictures, that is, 9 low-resolution first pictures may be acquired, that is, picture 1 to picture 9 respectively. Specifically, the sliding window (N/2×N/2) is moved by taking N/4 as the step size in the first direction (for example, a direction Y illustrated in FIG. 5) and the second direction (for example, a direction X illustrated in FIG. 5) respectively, to sequentially acquire picture 1 to picture 9. The direction X and the direction Y are perpendicular to each other. Through a picture segmentation method provided by the embodiment, the plurality of first pictures are acquired, and the adjacent first pictures are partially overlapped, so that defect information possibly existing in the original wafer picture may be completely reserved.

At S103, picture zooming is performed on the original wafer picture to acquire a second picture.

At S104, the picture zooming is performed on the plurality of first pictures to acquire a plurality of third pictures.

The second picture at S103 and the third pictures at S104 are the same in picture size and meet a size requirement of the wafer detection model to an input picture.

It is to be noted that an order of execution of operations S103 and S104 in the embodiment is exemplary only, and the picture zooming may also be performed simultaneously, or operation S104 is performed first and then operation S103 is performed.

It is to be noted that, in general, the size of the original wafer picture is greater than that of the input picture preset by the wafer detection model, and therefore, the picture zooming on the original wafer picture generally refers to picture compression on the original wafer picture. The first picture is acquired by performing the picture segmentation on the original wafer picture, so that the size of the first picture is smaller than that of the original wafer picture. If the size of the first picture is smaller than that of the input picture preset by the wafer detection model, the first picture is enlarged, and if the size of the first picture is greater than that of the input picture preset by the wafer detection model, the first picture is compressed.

At S105, the second picture and the plurality of third pictures are sequentially input into a wafer detection model to acquire a first detection result corresponding to the second picture and a second detection result corresponding to each third picture.

In the embodiment, the first detection result includes a first defect position where a wafer defect exists in the second picture, and the second detection result includes a second defect position where the wafer defect exists in each third picture. The defect position indicates a region of the wafer defect. The region may be a rectangular region, and correspondingly, the rectangular region may be represented by diagonal vertex coordinates or four vertex coordinates.

Optionally, in some embodiments, the detection result output by the wafer detection model further includes: a tag configured to indicate whether the wafer defect exists in the input picture and a defect category.

Exemplarily, the tag may be a tag value, for example, 0 represents that no wafer defect exists in the input picture, and 1 represents that the wafer defect exists in the input picture. The defect category may be indicated by an ID of the defect category. Exemplarily, the wafer defect includes a scratch defect, a grain defect, poor plating, poor edge coverage, and the like.

Optionally, in some embodiments, the detection result further includes confidence (which may be understood as a probability value) corresponding to the defect category.

At S106, a total detection result of the original wafer picture is determined according to the first detection result and the plurality of second detection results.

In an embodiment of the present disclosure, the operation that the total detection result of the original wafer picture is determined according to the first detection result and the plurality of second detection results includes the following operations.

The first defect position in the first detection result and the second defect position in each second detection result are mapped into a coordinate system of the original wafer picture to acquire a plurality of third defect positions; and a total defect position where the wafer defect exists in the original wafer picture is determined according to the plurality of third defect positions.

Since the first picture is acquired by segmenting the original wafer picture and the third picture is acquired by zooming the first picture, the defect position on the third picture may be mapped to the first picture and may further be mapped to the original wafer picture. Since the second picture is acquired by zooming the original wafer picture, the defect position on the second picture may be mapped to the original wafer picture. Through coordinate mapping of the defect position, the defect detection results of the second picture and each third picture are merged to eliminate the repeated defect position(s), thereby acquiring the total defect position where the wafer defect exists in the original wafer picture.

It is to be noted that, compared with the second picture acquired by directly zooming the original wafer picture, the third picture has low resolution, and the low resolution picture may completely reserve defect information that may exist in the original wafer picture, or the third picture enlarges the small-size defect that may exist in the original wafer picture, so that the defect information loss caused by the picture compression is avoided.

Exemplarily, the resolution of the original wafer picture acquired by a wafer inspection system (WIS) machine table is 2048×2048 pixels, the best input of the wafer detection model is a picture with 416×416 pixels, the minimum defect which may be recognized at present is 5×5 pixels, and for the small-size defect (within 10×10 pixels) appears in the original wafer picture, the compressed small-size defect cannot be recognized (the defect is compressed to be within 2×2 pixels). Therefore, the picture segmentation on the original wafer picture is taken into consideration to acquire the plurality of first pictures with the resolution of 512×512 pixels, and then the first pictures are compressed into the third pictures with the resolution of 416×416 pixels, so that the condition that the small-size defect in the third picture cannot be detected due to excessively high compression ratio is avoided.

According to the wafer detection method provided by the embodiment, an original wafer picture to be detected is received; picture segmentation is performed on the original wafer picture to acquire a plurality of first pictures; picture zooming is performed on the original wafer picture and the plurality of first pictures to respectively acquire a second picture and a plurality of third pictures, the second picture and the third pictures meet an input size requirement of the wafer detection model to an input picture; the second picture and the plurality of third pictures are sequentially input into a wafer detection model to acquire a first detection result corresponding to the second picture and a second detection result corresponding to each third picture; and a total detection result of the original wafer picture is determined according to the first detection result and a plurality of second detection results. According to the above detection solution, defect information loss caused by picture compression may be avoided, the detection precision of the large-size defect is guaranteed, and the detection precision of the small-size defect is greatly improved.

As can be seen from the above embodiment, the wafer detection model is preset in each GPU of the work node. A training procedure of the wafer detection model is described with the following embodiment in combination with FIG. 6 and FIG. 7.

Figure 6:
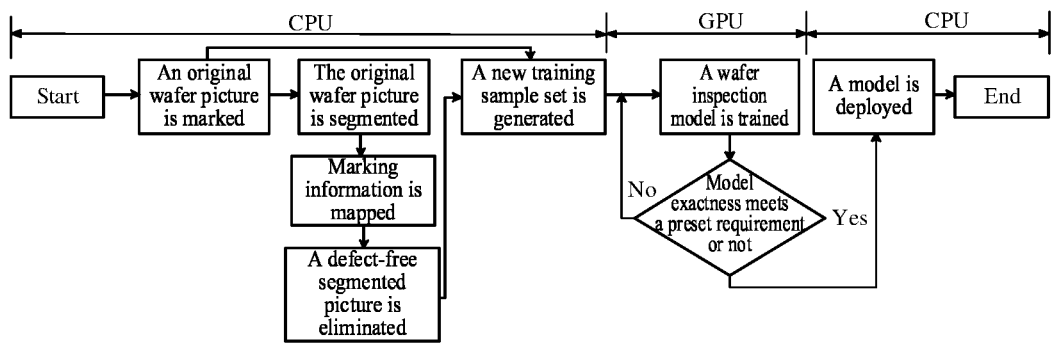
FIG. 6 is a first flowchart of a wafer detection model training procedure provided by an embodiment of the present disclosure.

Exemplarily, FIG. 6 is a first flowchart of a wafer detection model training procedure provided by an embodiment of the present disclosure. As illustrated in FIG. 6, before the wafer detection model is trained, a certain number of training samples need to be created. Specifically, creation of the training sample mainly includes: a marked original wafer picture is acquired, the original wafer picture is segmented, marking information is mapped (that is, a defect position coordinate is mapped), and a defect-free segmented picture is eliminated. The difference from the conventional solution is that both the original wafer picture and the segmented picture are placed into a training sample set. The marking information may be mapped to the segmented picture according to the marking information in the original wafer picture. In some embodiments, to minimize the number of pictures in the training sample set, if no wafer defect exists in the segmented picture, the picture will be eliminated and will not enter the model for training.

The wafer detection model is trained based on the created training sample set, whether model exactness of meets a preset requirement is determined, if the preset requirement is not met, model training is continued; if the preset requirement is met, the model training is finished, and the trained model is deployed on the GPU. Specifically, the model exactness includes accuracy, precision, and recall. The three parameters must all be greater than or equal to a preset value, for example, 90%, and it may be determined that the model exactness meets the preset requirement. The above three parameters are algorithmically controlled.

In a possible implementation manner, the creation of the training sample set may be executed on the CPU, the training and verification of the model may be executed on the GPU, and the trained wafer detection model may be deployed on the CPU, as illustrated in FIG. 6.

It is to be noted that the trained wafer detection model is deployed on the CPU in order to improve the wafer detection speed, and the wafer detection may be executed by the GPU in actual application. Specifically, the GPU retrieves an execution file from the CPU, that is, a related file of the wafer detection model deployed on the CPU, and performs wafer detection based on the retrieved execution file.

Figure 7:
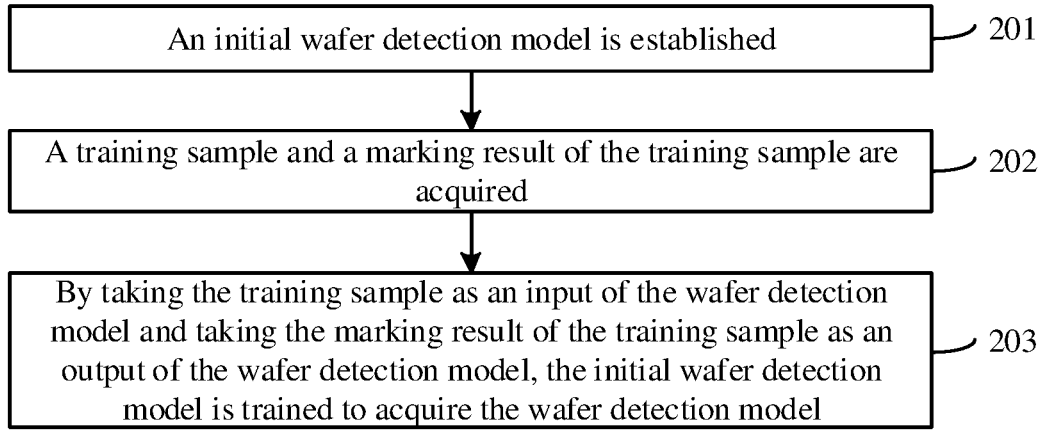
FIG. 7 is a second flowchart of a wafer detection model training procedure provided by an embodiment of the present disclosure.

Exemplarily, FIG. 7 is a second flow diagram of a wafer detection model training procedure provided by an embodiment of the present disclosure. As illustrated in FIG. 7, a wafer detection model training method includes as follows.

At S201, an initial wafer detection model is established.

At S202, a training sample and a marking result of the training sample are acquired.

At S203, by taking the training sample as an input of the wafer detection model and taking the marking result of the training sample as an output of the wafer detection model, the initial wafer detection model is trained to acquire the wafer detection model.

In the embodiment, the acquiring procedure of the training sample includes as follows.

At S2021, a wafer picture sample and a marking result corresponding to the wafer picture sample are acquired. The marking result includes a defect position where the wafer defect exists in the wafer picture sample.

Optionally, in some embodiments, the marking result corresponding to the wafer picture sample further includes an ID of the defect category. In the embodiment, the wafer picture sample includes wafer pictures of different wafer defect categories, different wafer defect positions and different environment conditions (for example, an illumination condition, a temperature environment, a humidity environment, and the like).

At S2022, picture segmentation is performed on the wafer picture sample to acquire a plurality of first segmented picture samples.

Specifically, the picture segmentation may be performed on the wafer picture sample by adopting a preset sliding window to acquire the plurality of first segmented picture samples.

As an example, the size of the wafer picture sample is N×N, and the size of the sliding window is N/n×N/n. The sliding window is moved by taking N/2n as a step size in a first direction and a second direction respectively to acquire (2n−1)×(2n−1) first segmented picture samples. As illustrated in FIG. 5, the first direction is the Y direction, the second direction is the X direction, and the first direction and the second direction are perpendicular to each other.

At S2033, a second segmented picture sample with the wafer defect is selected from the plurality of first segmented picture samples according to the defect position in the wafer picture sample.

At S2024, the wafer picture sample and the second segmented picture sample are taken as the training samples of the wafer detection model.

In the embodiment, the acquired training sample should include the picture samples of different wafer defect categories and the picture samples of the wafer defects of different sizes.

Optionally, in some embodiments, if the wafer picture sample or the second segmented picture sample does not meet the input size requirement of the wafer detection model, the following processing needs to be performed on the wafer picture sample or the second segmented picture sample.

The picture zooming is performed on the wafer picture sample, and the zoomed wafer picture sample is taken as one training sample of the wafer detection model.

Or, the picture zooming is performed on the second segmented picture sample, and the zoomed second segmented picture sample is taken as one training sample of the wafer detection model.

It is to be noted that, in general, the size of the wafer picture sample is greater than that of the input picture preset by the wafer detection model, and therefore, the picture zooming on the wafer picture sample generally refers to picture compression on the wafer picture sample. The second segmented picture sample is acquired by performing the picture segmentation on the wafer picture sample, so that the size of the second segmented picture sample is smaller than that of the wafer picture sample. If the size of the second segmented picture sample is smaller than that of the input picture preset by the wafer detection model, the second segmented picture sample is enlarged, and if the size of the second segmented picture sample is greater than that of the input picture preset by the wafer detection model, the second segmented picture sample is compressed.

According to the wafer detection model training method provided by the embodiment of the present disclosure, the small-size wafer defect is taken into consideration, the original wafer picture sample and the segmented wafer picture sample are taken as the picture samples for model training, and the trained wafer detection model may accurately recognize the wafer defects of different scales and different types, so that the detection precision of the detection system to the wafer defects of different scales is greatly improved.

According to the embodiment of the present disclosure, the wafer detection device may be divided into function modules according to the above method embodiment, for example, each function module may be divided corresponding to each function, and two or more functions may be integrated into one processing module. The above integrated module may be implemented either in hardware or in a software function module. It is to be noted that the division of the modules in the embodiment of the present disclosure is illustrative and is merely logical function division, and that additional division manners are possible for practical implementation. An example of dividing each function module corresponding to each function is described below.

Figure 8:
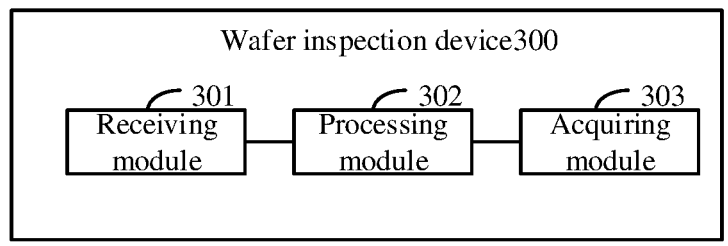
FIG. 8 is a structural schematic diagram of a wafer detection device provided by an embodiment of the present disclosure.

Exemplarily, FIG. 8 is a structural schematic diagram of a wafer detection device provided by an embodiment of the present disclosure. As illustrated in FIG. 8, the wafer detection device 300 of the embodiment includes: a receiving module 301 and a processing module 302.

The receiving module 301 is configured to receive an original wafer picture to be detected.

The processing module 302 is configured to: perform picture segmentation on the original wafer picture to acquire a plurality of first pictures, the plurality of first pictures being partially overlapped;

perform picture zooming on the original wafer picture to acquire a second picture;

perform the picture zooming on the plurality of first pictures to acquire a plurality of third pictures;

sequentially input the second picture and the plurality of third pictures into a wafer detection model to acquire a first detection result corresponding to the second picture and a second detection result corresponding to each third picture; and determine a total detection result of the original wafer picture according to the first detection result and the plurality of second detection results.

In an embodiment of the present disclosure, the processing module 302 is specifically configured to perform the picture segmentation on the original wafer picture by adopting a preset sliding window to acquire the plurality of first pictures.

In an embodiment of the present disclosure, the size of the original wafer picture is N×N, and the size of the sliding window is N/n×N/n. The processing module is specifically configured to: move the sliding window by taking N/2n as a step size in a first direction and a second direction respectively to acquire (2n−1)×(2n−1) first pictures. The first direction and the second direction are perpendicular to each other, and n is a positive integer greater than or equal to 2.

In an embodiment of the present disclosure, the first detection result includes a first defect position where a wafer defect exists in the second picture, and the second detection result includes a second defect position where the wafer defect exists in each third picture. The processing module 302 is specifically configured to:

map the first defect position in the first detection result and the second defect position in each second detection result into a coordinate system of the original wafer picture to acquire a plurality of third defect positions; and determine a total defect position where the wafer defect exists in the original wafer picture according to the plurality of third defect positions.

In an embodiment of the present disclosure, the device may further include an acquiring module 303.

The acquiring module 303 is configured to acquire a wafer picture sample and a marking result corresponding to the wafer picture sample. The marking result includes a defect position where the wafer defect exists in the wafer picture sample.

The processing module 302 is further configured to: perform the picture segmentation on the wafer picture sample to acquire a plurality of first segmented picture samples;

select a second segmented picture sample with the wafer defect from the plurality of first segmented picture samples according to the defect position in the wafer picture sample; and take the wafer picture sample and the second segmented picture sample as training samples of the wafer detection model.

In an embodiment of the present disclosure, the processing module 302 is specifically configured to perform the picture segmentation on the wafer picture sample by adopting a preset sliding window to acquire a plurality of first segmented picture samples.

In an embodiment of the present disclosure, the size of the wafer picture sample is N×N, and the size of the sliding window is N/n×N/n. The processing module 302 is specifically configured to: move the sliding window by taking N/2n as the step size in the first direction and the second direction respectively to acquire (2n−1)×(2n−1) first segmented picture samples. The first direction and the second direction are perpendicular to each other.

In an embodiment of the present disclosure, if the wafer picture sample or the second segmented picture sample does not meet an input size requirement of the wafer detection model, the processing module 302 is further configured to:

perform the picture zooming on the wafer picture sample, and take the zoomed wafer picture sample as one training sample of the wafer detection model; or perform the picture zooming on the second segmented picture sample, and take the zoomed second segmented picture sample as one training sample of the wafer detection model.

The wafer detection device provided by the embodiment of the present disclosure is configured to execute each step of the resource manager node in any above method embodiment, an implementation principle and a technical effect are similar and will not be described in detail herein.

Figure 9:
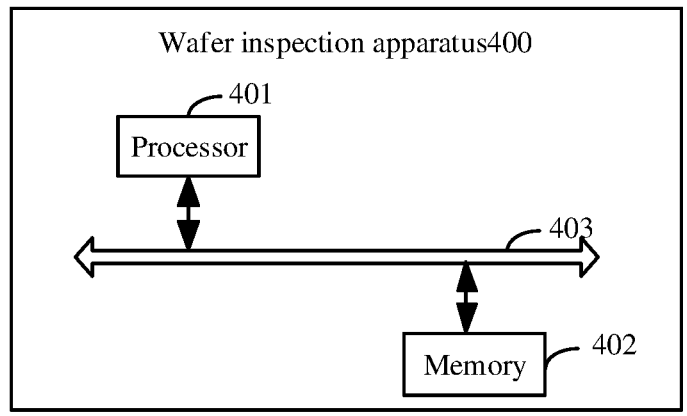
FIG. 9 is a hardware schematic diagram of a wafer detection device provided by an embodiment of the present disclosure.

Exemplarily, FIG. 9 is a hardware schematic diagram of a wafer detection device provided by an embodiment of the present disclosure. As illustrated in FIG. 9, the wafer detection apparatus 400 of the embodiment includes: at least one processor 401 (FIG. 9 only shows one processor); and a memory 402.

The memory 402 is in communication connection with the at least one processor.

The memory 402 stores instructions executable by the at least one processor 401. The instructions are executed by the at least one processor 401 to cause the wafer detection apparatus 400 to execute each step of the resource manager node in any above method embodiment.

Optionally, the memory 402 may be independent and may also be integrated with the processor 401.

When the memory 402 is a device independent of the processor 401, the wafer detection apparatus 400 further includes a bus 403, configured to connect the memory 402 and the processor 401.

The present disclosure further provides a computer-readable storage medium. The computer-readable storage medium stores computer execution instructions. When the computer execution instructions are executed by a processor, the instructions are configured to implement a technical solution of any above method embodiment.

The present disclosure further provides a computer program product, including a computer program. The computer program is executed by a processor to implement a technical solution of any above method embodiment.

It will be appreciated that the processor mentioned in the embodiment of the present disclosure may be a central processing unit (CPU), and may also be other general processors, a digital signal processor (DSP), an application specific integrated circuit (App) an application specific integrated circuit (ASIC), a field programmable gate array (FPGA) or other programmable logic device, a discrete gate or a transistor logic device, a discrete hardware component, and the like. The general processor may be a microprocessor or the processor may also be any conventional processor, and the like.

It will be further noted that the memory mentioned in the embodiment of the present disclosure may be a volatile memory or a nonvolatile memory, or may include both the volatile memory and the nonvolatile memory. The nonvolatile memory may be a read-only memory (ROM), a programmable rom (PROM), an erasable PROM (EPROM), and an electrically PROM (EEPROM), or a flash memory. The volatile memory may be a random access memory (RAM), which is used as an external cache. By exemplary and not restrictive illustration, many forms of RAM are available, for example, a static RAM (SRAM), a dynamic RAM (DRAM), a synchronous DRAM (SDRAM), a double data rate synchronous DRAM (DDR SDRAM), an enhanced SDRAM (ESDRAM), a synchlink DRAM (SLDRAM), and a direct rambus RAM (DR RAM).

It is to be noted that when the processor is the general processor, the DSP, the ASIC, the FPGA or other programmable logic device, the discrete gate or transistor logic device, or the discrete hardware component, the memory (a storage module) is integrated into the processor.

It is to be understood that the memory described herein is intended to include, but be not limited to, these and any other suitable type of memory.

It will be appreciated that in various embodiments of the present disclosure, the magnitude of serial numbers in each above procedure is not meant to imply an order of execution. The order of execution of each procedure should be determined by a function and inherent logic thereof, and should not impose any limitation on an implementation procedure of the embodiment of the present disclosure.

The above description is only specific embodiments of the present disclosure, but the scope of protection of the present disclosure is not limited herein. Any changes or substitutions that may be easily made by those skilled in the art within the technical scope disclosed in the present disclosure should be included within the scope of protection of the present disclosure. Therefore, the scope of protection of the present disclosure should be determined by the appended claims.

The invention claimed is:

1. A wafer detection method, comprising:
receiving an original wafer picture to be detected;
performing picture segmentation on the original wafer picture to acquire a plurality of first pictures, the plurality of first pictures being partially overlapped;
performing picture zooming on the original wafer picture to acquire a second picture;
performing the picture zooming on the plurality of first pictures to acquire a plurality of third pictures;
sequentially inputting the second picture and the plurality of third pictures into a wafer detection model to acquire a first detection result corresponding to the second picture and a second detection result corresponding to each third picture; and
determining a total detection result of the original wafer picture according to the first detection result and the plurality of second detection results.

2. The method of claim 1, wherein performing the picture segmentation on the original wafer picture to acquire the plurality of first pictures comprises:
performing the picture segmentation on the original wafer picture by adopting a preset sliding window to acquire the plurality of first pictures.

3. The method of claim 2, wherein a size of the original wafer picture is N×N, and a size of the preset sliding window is N/n×N/n;
wherein performing the picture segmentation on the original wafer picture by adopting the preset sliding window to acquire the plurality of first pictures comprises:
moving the preset sliding window by taking N/2n as a step size in a first direction and a second direction respectively to acquire (2n−1)×(2−1) first pictures, the first direction and the second direction being perpendicular to each other, and n being a positive integer greater than or equal to 2.

4. The method of claim 1, wherein the first detection result comprises a first defect position where a wafer defect exists in the second picture, and the second detection result comprises a second defect position where the wafer defect exists in each third picture;
wherein determining the total detection result of the original wafer picture according to the first detection result and the plurality of second detection results comprises:
mapping the first defect position in the first detection result and the second defect position in each second detection result into a coordinate system of the original wafer picture to acquire a plurality of third defect positions; and
determining a total defect position where the wafer defect exists in the original wafer picture according to the plurality of third defect positions.

5. The method of claim 1, wherein the wafer detection model is acquired by training through a training sample based on a deep neural network model, an acquiring procedure of the training sample comprising:
acquiring a wafer picture sample and a marking result corresponding to the wafer picture sample, the marking result comprising a defect position where a wafer defect exists in the wafer picture sample;
performing the picture segmentation on the wafer picture sample to acquire a plurality of first segmented picture samples;
selecting a second segmented picture sample with the wafer defect from the plurality of first segmented picture samples according to the defect position in the wafer picture sample; and
taking the wafer picture sample and the second segmented picture sample as the training samples of the wafer detection model.

6. The method of claim 5, wherein performing the picture segmentation on the wafer picture sample to acquire the plurality of first segmented picture samples comprises:
performing the picture segmentation on the wafer picture sample by adopting a preset sliding window to acquire the plurality of first segmented picture samples.

7. The method of claim 6, wherein a size of the wafer picture sample is N×N, and a size of the sliding window is N/n×N/n;
wherein performing the picture segmentation on the wafer picture sample by adopting the preset sliding window to acquire the plurality of first segmented picture samples comprises:
moving the sliding window by taking N/2n as a step size in a first direction and a second direction respectively to acquire (2n−1)×(2n−1) first segmented picture samples, the first direction and the second direction being perpendicular to each other.

8. The method of claim 5, wherein in response to determining that the wafer picture sample or the second segmented picture sample does not meet an input size requirement of the wafer detection model, the method further comprises:
performing the picture zooming on the wafer picture sample, and taking the zoomed wafer picture sample as one training sample of the wafer detection model; or
performing the picture zooming on the second segmented picture sample, and taking the zoomed second segmented picture sample as one training sample of the wafer detection model.

9. A wafer detection device, comprising:
a processor; and
a memory configured to store instructions executable by the processor;
wherein the processor is configured to:
receive an original wafer picture to be detected;
perform picture segmentation on the original wafer picture to acquire a plurality of first pictures, the plurality of first pictures being partially overlapped;
perform picture zooming on the original wafer picture to acquire a second picture;
perform the picture zooming on the plurality of first pictures to acquire a plurality of third pictures;
sequentially input the second picture and the plurality of third pictures into a wafer detection model to acquire a first detection result corresponding to the second picture and a second detection result corresponding to each third picture; and
determine a total detection result of the original wafer picture according to the first detection result and the plurality of second detection results.

10. The device of claim 9, wherein the processor is specifically configured to:
perform the picture segmentation on the original wafer picture by adopting a preset sliding window to acquire the plurality of first pictures.

11. The device of claim 10, wherein a size of the original wafer picture is N×N, and a size of the preset sliding window is N/n×N/n;
wherein the processor is specifically configured to:
move the preset sliding window by taking N/2n as a step size in a first direction and a second direction respectively to acquire (2n−1)×(2n−1) first pictures, the first direction and the second direction being perpendicular to each other, and n being a positive integer greater than or equal to 2.

12. The device of claim 9, wherein the first detection result comprises a first defect position where a wafer defect exists in the second picture, and the second detection result comprises a second defect position where the wafer defect exists in each third picture;
wherein the processor is specifically configured to:
map the first defect position in the first detection result and the second defect position in each second detection result into a coordinate system of the original wafer picture to acquire a plurality of third defect positions; and
determine a total defect position where the wafer defect exists in the original wafer picture according to the plurality of third defect positions.

13. The device of claim 9, wherein the processor is configured to: acquire a wafer picture sample and a marking result corresponding to the wafer picture sample, the marking result comprising a defect position where a wafer defect exists in the wafer picture sample;
perform the picture segmentation on the wafer picture sample to acquire a plurality of first segmented picture samples;
select a second segmented picture sample with the wafer defect from the plurality of first segmented picture samples according to the defect position in the wafer picture sample; and
take the wafer picture sample and the second segmented picture sample as training samples of the wafer detection model.

14. The device of claim 13, wherein the processor is specifically configured to:
perform the picture segmentation on the wafer picture sample by adopting a preset sliding window to acquire the plurality of first segmented picture samples.

15. The device of claim 14, wherein a size of the wafer picture sample is N×N, and a size of the preset sliding window is N/n×N/n;
wherein the processor is specifically configured to:
move the preset sliding window by taking N/2n as a step size in a first direction and a second direction respectively to acquire (2n−1)×(2n−1) first segmented picture samples, the first direction and the second direction being perpendicular to each other.

16. The device of claim 13, wherein in response to determining that the wafer picture sample or the second segmented picture sample does not meet an input size requirement of the wafer detection model, the processor is further configured to:
perform the picture zooming on the wafer picture sample, and taking the zoomed wafer picture sample as one training sample of the wafer detection model; or
perform the picture zooming on the second segmented picture sample, and taking the zoomed second segmented picture sample as one training sample of the wafer detection model.

17. A non-transitory computer-readable storage medium having stored therein instructions that, when executed by a processor of a wafer detection device, causes the wafer detection device to perform a wafer detection method, the method comprising:
receiving an original wafer picture to be detected;
performing picture segmentation on the original wafer picture to acquire a plurality of first pictures, the plurality of first pictures being partially overlapped;
performing picture zooming on the original wafer picture to acquire a second picture;
performing the picture zooming on the plurality of first pictures to acquire a plurality of third pictures;
sequentially inputting the second picture and the plurality of third pictures into a wafer detection model to acquire a first detection result corresponding to the second picture and a second detection result corresponding to each third picture; and
determining a total detection result of the original wafer picture according to the first detection result and the plurality of second detection results.

18. The non-transitory computer-readable storage medium of claim 17, wherein performing the picture segmentation on the original wafer picture to acquire the plurality of first pictures comprises:
performing the picture segmentation on the original wafer picture by adopting a preset sliding window to acquire the plurality of first pictures.

19. The non-transitory computer-readable storage medium of claim 17, wherein the first detection result comprises a first defect position where a wafer defect exists in the second picture, and the second detection result comprises a second defect position where the wafer defect exists in each third picture;
wherein determining the total detection result of the original wafer picture according to the first detection result and the plurality of second detection results comprises:
mapping the first defect position in the first detection result and the second defect position in each second detection result into a coordinate system of the original wafer picture to acquire a plurality of third defect positions; and determining a total defect position where the wafer defect exists in the original wafer picture according to the plurality of third defect positions.

20. The non-transitory computer-readable storage medium of claim 17, wherein the wafer detection model is acquired by training through a training sample based on a deep neural network model, an acquiring procedure of the training sample comprising:
   acquiring a wafer picture sample and a marking result corresponding to the wafer picture sample, the marking result comprising a defect position where a wafer defect exists in the wafer picture sample;
   performing the picture segmentation on the wafer picture sample to acquire a plurality of first segmented picture samples;
   selecting a second segmented picture sample with the wafer defect from the plurality of first segmented picture samples according to the defect position in the wafer picture sample; and
   taking the wafer picture sample and the second segmented picture sample as the training samples of the wafer detection model.

\* \* \* \* \*